United States Patent
Shin et al.

(10) Patent No.: US 11,188,415 B2
(45) Date of Patent: Nov. 30, 2021

(54) MEMORY SYSTEM AND OPERATING METHOD OF MEMORY SYSTEM

(71) Applicant: SAMSUNG ELECTRONICS CO., LTD., Suwon-si (KR)

(72) Inventors: Beomkyu Shin, Seongnam-si (KR); Kui-Yon Mun, Hwaseong-si (KR); Sungkyu Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 16/533,905

(22) Filed: Aug. 7, 2019

(65) Prior Publication Data

US 2020/0183777 A1    Jun. 11, 2020

(30) Foreign Application Priority Data

Dec. 11, 2018 (KR) .................... 10-2018-0159269

(51) Int. Cl.
| | | |
|---|---|---|
| G06F 11/10 | (2006.01) | |
| G11C 11/409 | (2006.01) | |
| G06F 13/16 | (2006.01) | |
| G11C 29/34 | (2006.01) | |
| G11C 29/52 | (2006.01) | |

(52) U.S. Cl.
CPC ........ G06F 11/102 (2013.01); G06F 13/1668 (2013.01); G11C 11/409 (2013.01); G11C 29/34 (2013.01); G11C 29/52 (2013.01)

(58) Field of Classification Search
CPC ............ G11C 13/0004; G11C 16/3495; G11C 2211/4062; G11C 11/409; G11C 2029/0409; G11C 13/0035; G11C 13/0033; G11C 11/4076; G11C 11/4078; G11C 13/004; G11C 29/52; G11C 16/349; G11C 29/34; G11C 16/34; G11C 16/26; G06F 11/102; G06F 13/1668
See application file for complete search history.

(56) References Cited

U.S. PATENT DOCUMENTS

| | | |
|---|---|---|
| 7,990,790 B2 | 8/2011 | Lee |
| 8,108,592 B2 | 1/2012 | Kim et al. |
| 8,161,333 B2 | 4/2012 | Kasuga et al. |
| 8,634,225 B2 | 1/2014 | Kang |
| 8,972,653 B2 | 3/2015 | Lin |
| 9,141,536 B2 | 9/2015 | Faber |
| 9,612,958 B1 | 4/2017 | Asnaashari |
| 9,875,812 B2 | 1/2018 | Otterstedt et al. |

(Continued)

FOREIGN PATENT DOCUMENTS

JP    3866511 B2    1/2007

*Primary Examiner* — Guy J Lamarre
(74) *Attorney, Agent, or Firm* — Volentine, Whitt & Francos, PLLC

(57) ABSTRACT

A memory system includes a memory device including memory cells, and a controller that performs a write operation, a read operation, and a check operation on the memory device. During the check operation, the controller controls the memory device to read check data from target memory cells of the memory cells by using a check level, compares the check data with original data stored in the target memory cells, and determines a reliability of the target memory cells or the check data based on a result of the comparison.

19 Claims, 12 Drawing Sheets

(56) References Cited

U.S. PATENT DOCUMENTS

| | | | | |
|---|---|---|---|---|
| 2008/0019176 | A1* | 1/2008 | Fujisawa | G11C 11/5628 365/185.03 |
| 2008/0276037 | A1* | 11/2008 | Chang | G06F 3/0613 711/103 |
| 2010/0169726 | A1* | 7/2010 | Kasuga | G11C 29/50016 714/719 |
| 2011/0235403 | A1* | 9/2011 | Kang | G11C 29/50 365/148 |
| 2013/0238955 | A1* | 9/2013 | D'Abreu | G11C 29/04 714/763 |
| 2018/0083651 | A1* | 3/2018 | Song | H03M 13/2906 |
| 2018/0210786 | A1* | 7/2018 | Kim | G06F 11/1068 |
| 2019/0051359 | A1* | 2/2019 | Yoo | G11C 16/28 |

\* cited by examiner

MEMORY SYSTEM AND OPERATING METHOD OF MEMORY SYSTEM

CROSS-REFERENCE TO RELATED APPLICATIONS

A claims of priority under 35 U.S.C. § 119 is made to Korean Patent Application No. 10-2018-0159269 filed on Dec. 11, 2018, in the Korean Intellectual Property Office, the entire content of which is hereby incorporated by reference.

BACKGROUND

The present inventive concepts described herein relate to semiconductor devices, and more particularly to memory systems which perform a check read operation for amplifying an error to check the degree of wear, and operating methods of the memory systems.

Memory systems may include various kinds of semiconductor memory devices. For example, semiconductor memory devices may include volatile memory devices such as static random access memory (SRAM) or dynamic random access memory (DRAM) which lose data when powered-off. Semiconductor memory devices may also include nonvolatile memory devices such as flash memory, phase-change memory, ferroelectric memory, magnetic memory, or resistive memory for example, which retain data when powered-off.

As access to a semiconductor memory device is repeated, the semiconductor memory device and/or the data stored in the semiconductor memory device may deteriorate. As the deterioration progresses, the reliability of the integrity of the data stored in the semiconductor memory device decreases. In a conventional semiconductor memory device, the degree of deterioration may be monitored by monitoring the tendency of errors of the data stored in the semiconductor memory device to increase.

Some semiconductor memory devices may have very low error level. For such semiconductor memory devices having very low error level, error correction schemes may be adopted to correct a very small number of errors. However, with such semiconductor memory devices having very low error level, monitoring of the degree of deterioration of the semiconductor memory device or data based on the tendency of the number of errors to increase may have very low resolution and very low accuracy.

SUMMARY

Embodiments of the inventive concept provide a memory system which monitors the degree of wear of a semiconductor memory device or data stored in the semiconductor memory device with high resolution and high accuracy, and an operating method of the memory system.

Embodiments of the inventive concepts provide a memory system that includes a memory device including memory cells; and a controller that performs a write operation, a read operation, and a check operation on the memory device. During the check operation, the controller controls the memory device to read check data from target memory cells of the memory cells by using a check level; compares the check data with original data stored in the target memory cells to provide a comparison result, and determines a reliability of the target memory cells or the check data based on the comparison result.

Embodiments of the inventive concepts further provide a memory system that includes a memory device including memory cells and monitor memory cells; and a controller that performs a write operation, a read operation, and a check operation on the memory device. During the check operation, the controller controls the memory device to read check data from the monitor memory cells by using a check level; compares the check data with original data stored in the monitor memory cells to provide a comparison result, and determines a reliability of the memory cells or data stored in the memory cells based on the comparison result.

Embodiments of the inventive concepts still further provide an operating method of a memory system. The memory system includes a memory device including memory cells and a controller controlling the memory device. The operating method includes performing, at the memory device, a check operation on target memory cells of the memory cells; determining, at the controller, a reliability of the target memory cells based on a result of the check operation; and when the reliability of the target memory cells is determined to be low, performing, at the memory device, the check operation on selected memory cells in a selected area of the memory device including the target memory cells. The check operation includes reading, at the memory device, check data by using a check level from the target memory cells or the selected memory cells; and comparing, at the controller, the check data with original data stored in the target memory cells or the selected memory cells. The check level is different from an ordinary read level used in an ordinary read operation of the memory device.

Embodiments of the inventive concepts also provide a memory system that includes a memory device including memory cells; and a controller. The controller reads first data from target memory cells using a read threshold level set between states of the memory cells, performs error correction decoding on the first data to provide second data, reads third data from the target memory cells using a check read level different than the read threshold level, removes error correction parity from the third data to provide fourth data, compares the second data with the fourth data to provide a comparison result, and determines reliability of the target memory cells based on the comparison result.

BRIEF DESCRIPTION OF THE FIGURES

The above and other objects and features of the inventive concepts will become apparent in view of the following detailed description of exemplary embodiments with reference to the accompanying drawings.

DETAILED DESCRIPTION

Hereinafter, embodiments of the inventive concepts are described in detail and clearly to such an extent that one of ordinary skill in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
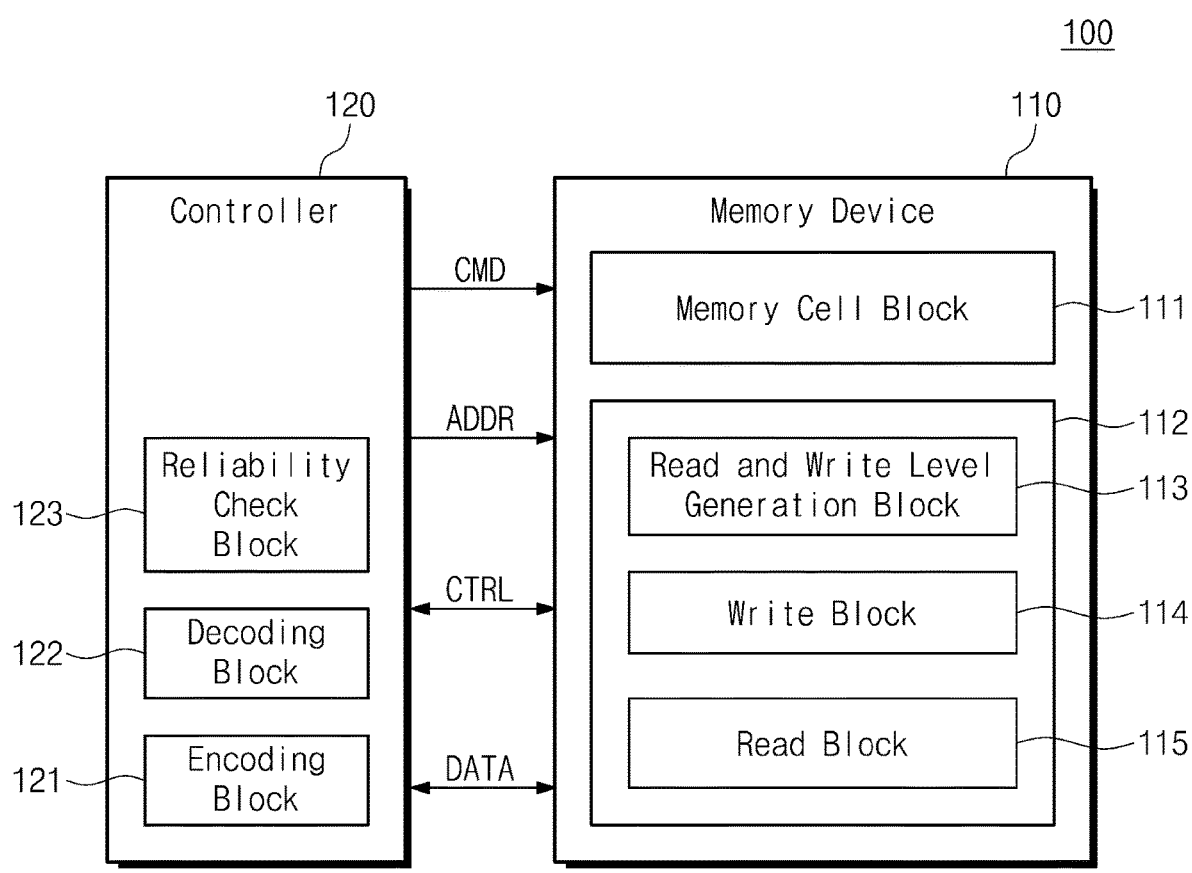
FIG. 1 illustrates a block diagram of a memory system according to embodiments of the inventive concepts.

FIG. 1 illustrates a block diagram of a memory system 100 according to embodiments of the inventive concepts. Referring to FIG. 1, the memory system 100 includes a memory device 110 and a controller 120. The memory device 110 may include volatile memory devices such as for example static random access memory (SRAM), dynamic random access memory (DRAM) or the like, which lose data when powered-off.

The memory device 110 may also include nonvolatile memory devices such as for example flash memory, phase-change memory, ferroelectric memory, magnetic memory, resistive memory, or the like, which retain data when powered-off. The memory device 110 may be used as a main storage device or an auxiliary storage device within a host system including the memory system 100.

The memory device 110 may receive a command CMD and an address ADDR from the controller 120. The memory device 110 may exchange control signals CTRL and data "DATA" with the controller 120. The memory device 110 may access memory cells, which the address ADDR indicates, based on the command CMD and the control signals CTRL. The memory device 110 may provide the data "DATA" to the controller 120 as a result of a read operation (i.e., an access operation), or may receive the data "DATA" from the controller 120 for a write operation (i.e., an access operation).

The memory device 110 includes a memory cell block 111 and a peripheral block 112. The memory cell block 111 may include memory cells (e.g., volatile memory cells or non-volatile memory cells). The memory cells may be arranged in rows and columns. The memory cells arranged in the rows and the columns may be accessed in units of various sizes. The access operation to the memory cells may include for example a write operation and a read operation.

The peripheral block 112 is configured to access the memory cell block 111. The peripheral block 112 includes a read and write level generation block 113, a write block 114, and a read block 115. The read and write level generation block 113 may generate a read level (or a check level) necessary upon performing a read operation (or a check operation being a modification of the read operation) on selected memory cells in a selected area of the memory cell block 111.

For example, the read level (or the check level) may include a voltage level or a current level (e.g., the amount of current) to be applied to the selected memory cells (e.g., memory cells which the address ADDR indicates) upon performing the read operation (or the check operation). For example, the read level may be applied to a row (or rows) of selected memory cells during the read operation (or the check operation).

Also, the read and write level generation block 113 may generate a write level necessary upon performing a write operation on selected memory cells in a selected area of the memory cell block 111. For example, the write level may include a voltage level or a current level (e.g., the amount of current) to be applied to the selected memory cells upon performing the write operation. For example, the write level may be applied to a row (or rows) of selected memory cells during the write operation.

The write block 114 may perform the write operation on the selected memory cells by applying (or biasing) voltages or currents to columns of the selected memory cells. For example, the write block 114 may write the data "DATA" transmitted from the controller 120 in the selected memory cells which the address ADDR indicates, based on the command CMD (e.g., a write command) and the control signals CTRL transmitted from the controller 120.

The read block 115 may perform the read operation on the selected memory cells by sensing voltages or currents of the columns of the selected memory cells. For example, the read block 115 may read the data "DATA" from the selected memory cells which the address ADDR indicates, based on the command CMD (e.g., a read command) and the control signals CTRL transmitted from the controller 120, and may transmit the read data to the controller 120.

The controller 120 may allow the memory device 110 to perform the write operation or the read operation. The controller 120 may transmit the command CMD and the address ADDR to the memory device 110. The controller 120 may exchange the control signals CTRL and the data "DATA" with the memory device 110. The controller 120 may allow the memory device 110 to perform the write operation, the read operation, or the check operation.

The controller 120 includes an encoding block 121, a decoding block 122, and a reliability check block 123. The encoding block 121 may perform error correction encoding on data which the controller 120 is to transmit to the memory device 110 during the write operation. The encoding block 121 may add parity to original data by performing error correction encoding. The parity may include one or more bits and may provide an error correction function. The data "DATA" encoded by the encoding block 121 may be transmitted to the memory device 110.

The decoding block 122 may perform error correction decoding on the data "DATA" which the controller 120 receives from the memory device 110 during the read operation. By performing error correction decoding by using parity of the data "DATA", the decoding block 122 may correct errors in the received data "DATA" and may recover the original data.

The reliability check block 123 may control the memory device 110 and the controller 120 such that the memory device 110 performs the check operation. For example, the reliability check block 123 may allow the controller 120 to generate the command CMD, the address ADDR, and the control signals CTRL for the check operation.

During the check operation, the read and write level generation block 113 of the memory device 110 may generate a check level different from an ordinary read level. The read block 115 may read check data from memory cells selected by the address ADDR by using the check level. For example, the read operation using the check level may be a read operation of amplifying (or increasing) the number of errors.

The memory device 110 may transmit the check data as the data "DATA" to the controller 120. The reliability check block 123 may monitor the degree of deterioration of the memory device 110 by using the check data received from the memory device 110 during the check operation. Because the check data include the amplified errors, the reliability check block 123 may monitor the degree of deterioration with the amplified resolution.

Figure 2:
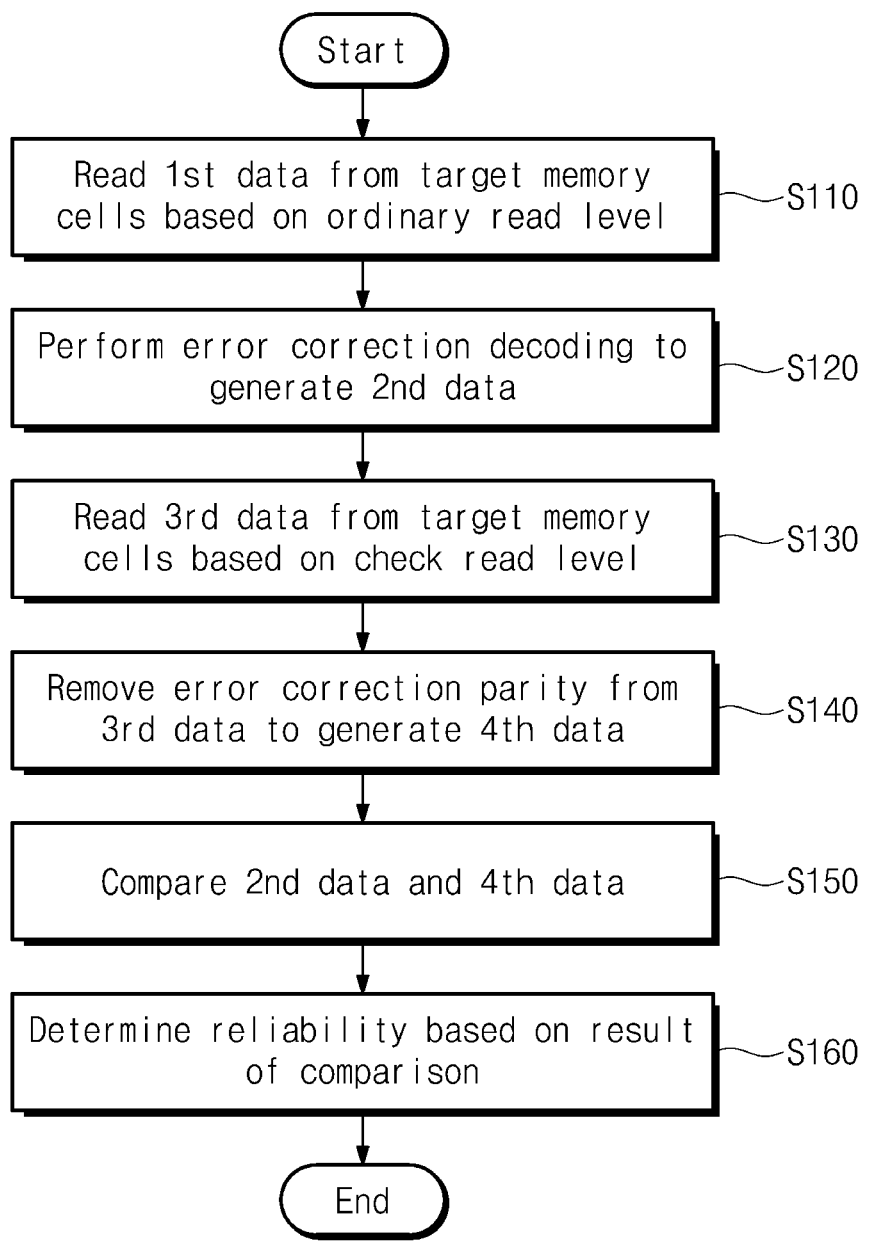
FIG. 2 illustrates a flowchart of an operating method of a memory system according to embodiments of the inventive concepts.

FIG. 2 illustrates a flowchart of an operating method of the memory system 100 according to embodiments of the inventive concepts. Referring to FIGS. 1 and 2, in operation S110, the controller 120 reads first data from target memory cells of the memory device 110, based on an ordinary read level. Because operation S110 is based on the ordinary read level, operation S110 may correspond to the read operation. The data "DATA" read as the first data may include original data and parity, and one or more bits of the original data and the parity may be damaged (e.g., inverted) due to errors.

In operation S120, the decoding block 122 of the controller 120 performs error correction decoding on the first data to generate second data. For example, because errors are corrected by the error correction decoding, the second data may correspond to the original data.

In operation S130, the controller 120 reads third data from the target memory cells of the memory device 110, based on a check read level. Because operation S130 is based on the check read level, operation S130 may correspond to the check operation. The data "DATA" read as the third data may include the original data and the parity, and one or more bits of the original data and the parity may be damaged (e.g., inverted) due to errors. The third data may be characterized as check data.

For example, because the third data are read based on the check read level different from the ordinary read level, the number of damaged bits of the third data, that is, the number of error bits may be more than the number of errors of the first data. In operation S140, the reliability check block 123 of the controller 120 removes the parity from the third data to generate fourth data. For example, the reliability check block 123 may generate the fourth data by removing bits, which are at a position corresponding to the parity, of the third data (regardless of whether an error exists). The fourth data may be characterized as second check data, and corresponds to the third data except without the parity.

The fourth data may include the original data, and one or more bits of the original data may be damaged (or inverted) due to errors. That is, the fourth data may include errors generated by the check level.

In operation S150, the reliability check block 123 of the controller 120 compares the second data generated in operation S120 with the fourth data generated in operation S140. The second data may include the original data which does not include an error. The fourth data may include the original data including an error generated by the check level. By comparing the second data and the fourth data, the reliability check block 123 may calculate the number of errors occurring due to a difference between the check level and the read level.

In operation S160, the reliability check block 123 of the controller 120 determines reliability. For example, the reliability check block 123 may determine the reliability of the target memory cells or data stored in the target memory cells, based on a result of the comparison in operation S150.

Figure 3:
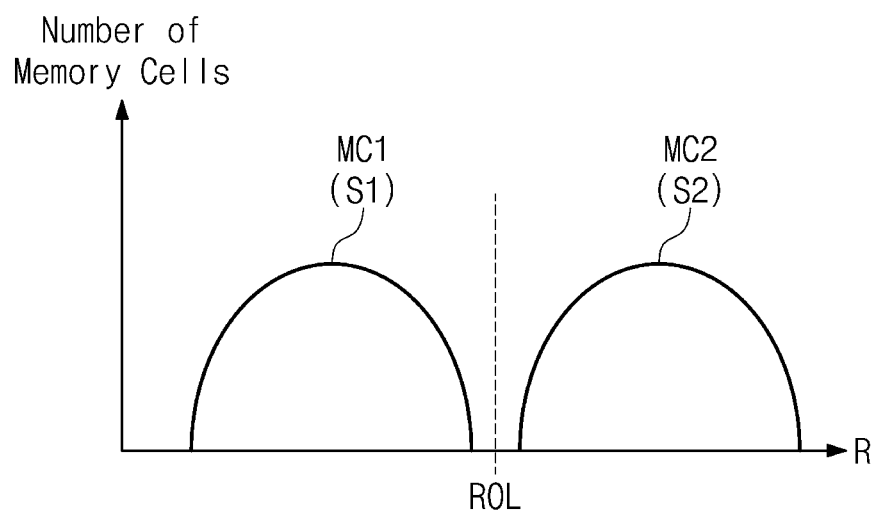
FIG. 3 illustrates an example of states of memory cells in which data are written by a write operation.

FIG. 3 illustrates an example of states of memory cells in which data are written by a write operation. Depending on the kinds of memory cells in which the data are written, FIG. 3 may show states of the memory cells according to various parameters. For example, FIG. 3 may show states of various parameters of the memory cells such as threshold voltages and resistance values of transistors of the memory cells, and voltages charged in capacitors of the memory cells.

For a brief description, as illustrated on a horizontal axis of FIG. 3, it is assumed that the states of the memory cells are shown in the form of a resistance value "R". In FIG. 3, a vertical axis represents the number of memory cells. That is, FIG. 3 shows a distribution of memory cells according to the resistance value "R".

Referring to FIGS. 1 and 3, as the data "DATA" including original data and parity are written by the write operation, the memory cells may be classified into first memory cells MC1 having a first state S1 and second memory cells MC2 having a second state S2. The first state S1 may be a low-resistance state, and the second state S2 may be a high-resistance state.

During the write operation, an operation of switching specific memory cells from the first state S1 to the second state S2 may be a set operation. During the write operation, an operation of switching specific memory cells from the second state S2 to the first state S1 may be a reset operation.

During the read operation, an ordinary level resistance value ROL may be used which is placed between a range of resistance values of the first memory cells MC1 of the first state S1 and a range of resistance values of the second memory cells MC2 of the second state S2. For example, an ordinary read level (e.g., a voltage or a current amount) corresponding to the ordinary level resistance value ROL may be supplied to a row of selected target memory cells. That is, the ordinary read level may be characterized as a read threshold level set between programmed states of the memory cells that may be used to determine whether the memory cells are in the first state S1 or the second state S2.

The read block 115 may determine whether resistance values of the selected target memory cells are greater than the ordinary level resistance value ROL or are smaller than the ordinary level resistance value ROL, based on current amounts or voltages of columns of the selected target memory cells. When a resistance value of a selected target memory cell of a specific column is smaller than the ordinary level resistance value ROL, the selected target memory cell is determined as being in the first state S1. When the resistance value of the selected target memory cell of the specific column is greater than the ordinary level resistance value ROL, the selected target memory cell is determined as being in the second state S2.

Figure 4:
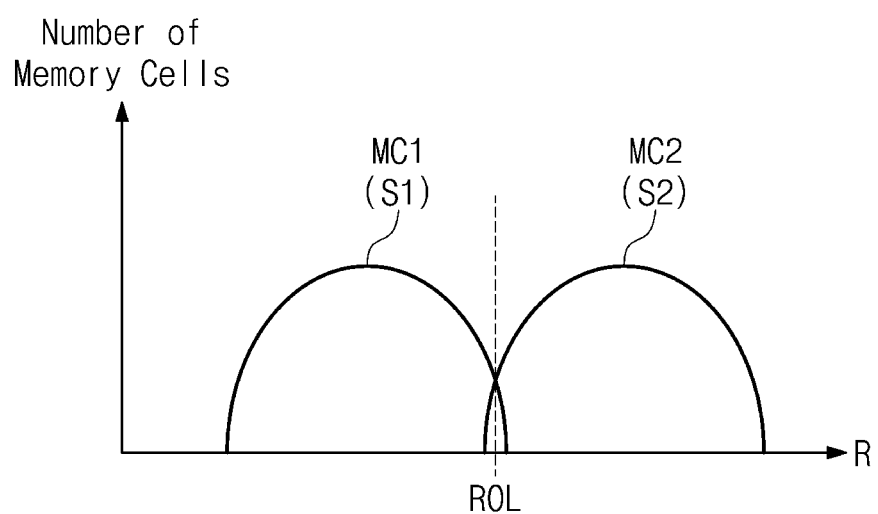
FIG. 4 illustrates an example in which first memory cells and second memory cells of FIG. 3, or data stored therein, deteriorate.

FIG. 4 illustrates an example in which the first memory cells MC1 and the second memory cells MC2 of FIG. 3 or data stored therein deteriorate. Referring to FIGS. 1, 3, and 4, as the first memory cells MC1 and the second memory cells MC2 of FIG. 3 or data stored therein deteriorate, ranges of resistance values of the first and second memory cells MC1 and MC2 may deviate from initial ranges.

For example, the range of the resistance values of the first memory cells MC1 which are written to have the first state S1 may increase. Resistance values of some of the first memory cells MC1 may become greater than the ordinary level resistance value ROL, and thus, the first memory cells MC1 having the resistance values greater than the ordinary level resistance value ROL may be abnormally determined as the second memory cells MC2.

The range of the resistance values of the second memory cells MC2 which are written to have the second state S2 may decrease. Resistance values of some of the second memory cells MC2 may become smaller than the ordinary level resistance value ROL, and thus, the second memory cells MC2 having the resistance values smaller than the ordinary level resistance value ROL may be abnormally determined as the first memory cells MC1.

The memory cells abnormally determined may cause error bits during the read operation. As the first and second memory cells MC1 and MC2 or data stored in the first and second memory cells MC1 and MC2 become worse (in other words as the memory cells and/or data continue to deteriorate), the number of error bits may increase.

In an embodiment, some memory devices such as phase change memory or dynamic random access memory are characterized in that error level is low. In a same environment, the memory devices of low error level such as phase change memory or dynamic random access memory cause (i.e., generate or result in) fewer error bits as compared with any other different type memory devices. Accordingly, the memory devices of the low error level include the encoding block 121 and the decoding block 122 which may correct fewer error bits than any other different type memory devices.

In general, the degree of deterioration of the first and second memory cells MC1 and MC2, or data stored in the first and second memory cells MC1 and MC2, may be monitored based on the number of errors. For example, as the number of errors increases, it may be determined that the degree of deterioration of the first and second memory cells MC1 and MC2, or data stored in the first and second memory cells MC1 and MC2, increases.

The encoding block 121 and the decoding block 122 included in the memory devices of the low error level correct a small number of error bits. Accordingly, a range (i.e., a range of the number of error bits) capable of monitoring the degree to which the number of errors increases is narrow compared to any other different type memory devices. That is, the memory devices of the low error level may be understood as having a low resolution for monitoring the degree of deterioration.

For example, the number of error bits correctable by the decoding block 122 may be "4". When the read operation is repeatedly performed during a first time interval, the number of error bits of the data "DATA" read from the memory device 110 may be "3". In a second time interval after the first time interval, the number of error bits may increase as much as 2 bits.

When the number of error bits increases as much as 2 bits, error bits of the memory device 110 may be out of a range correctable by the decoding block 122. As such, there is a limitation on monitoring the number of error bits in the memory device of the low error level. Accordingly, it is difficult to determine the degree of deterioration as the number of error bits changes.

Figure 5:
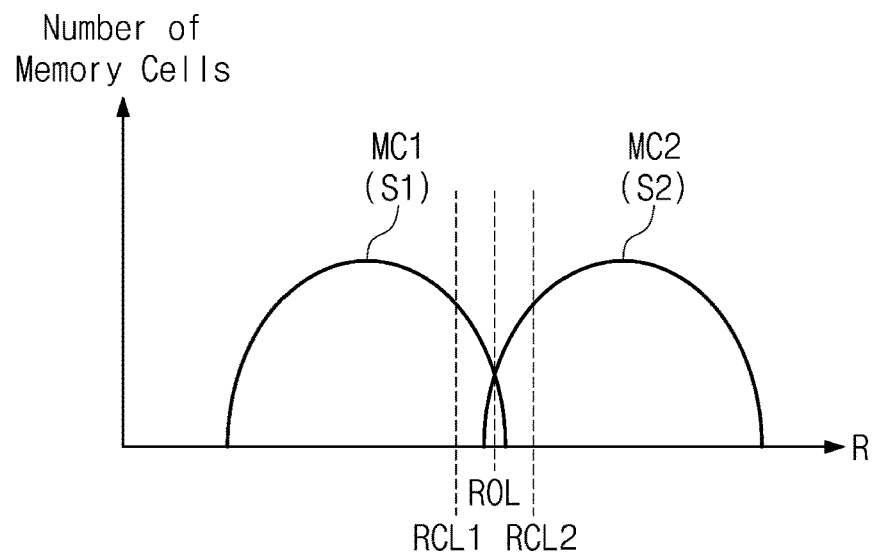
FIG. 5 illustrates an example of check level resistance values corresponding to check levels used during a check read operation in a memory system according to embodiments of the inventive concepts.

FIG. 5 illustrates an example of check level resistance values corresponding to check levels used during the check read operation in the memory system 100 according to embodiments of the inventive concepts. Referring to FIGS. 1, 4, and 5, a first check level resistance value RCL1 and a second check level resistance value RCL2 may be selected.

For example, the first check level resistance value RCL1 may be smaller than the ordinary level resistance value ROL. When the first check level resistance value RCL1 is selected, the read and write level generation block 113 may generate a first check level corresponding to the first check level resistance value RCL1. Because the first check level resistance value RCL1 is smaller than the ordinary level resistance value ROL, a voltage used as the first check level may be smaller than a voltage of an ordinary read level, and a current amount used as the first check level may be greater than a current amount of the ordinary read level.

For example, the second check level resistance value RCL2 may be greater than the ordinary level resistance value ROL. When the second check level resistance value RCL2 is selected, the read and write level generation block 113 may generate a second check level corresponding to the second check level resistance value RCL2. Because the second check level resistance value RCL2 is greater than the ordinary level resistance value ROL, a voltage used as the second check level may be greater than the voltage of the ordinary read level, and a current amount used as the second check level may be smaller than the current amount of the ordinary read level.

As illustrated in FIG. 5, upon using the first check level resistance value RCL1, compared with the case of using the ordinary level resistance value ROL, the number of memory cells from among the first memory cells MC1 which are abnormally determined as being in the second state S2 increases. Likewise, upon using the second check level resistance value RCL2, compared with the case of using the ordinary level resistance value ROL, the number of memory cells from among the second memory cells MC2 which are abnormally determined as being in the first state S1 increases.

By using the first check level resistance value RCL1 and the second check level resistance value RCL2, that is, by using the first check level and the second check level of the read and write level generation block 113, the number of errors of data read from the first and second memory cells MC1 and MC2 is increased (or amplified) compared with the case of using the ordinary read level.

As different reference levels are used to determine the first and second memory cells MC1 and MC2 in a state where distribution shapes of the first and second memory cells MC1 and MC2 are identical, errors indicating characteristics (e.g., the degree of deterioration) of the distribution shapes of the first and second memory cells MC1 and MC2 and corresponding to an amplified count are detected.

In particular, as described with reference to operation S150 of FIG. 2, even though errors, the number of which is out of a correctable range of the decoding block 122, occur during the check read operation, the number of errors may be accurately determined through comparison with original data previously obtained (e.g., obtained in operation S110 and operation S120 of FIG. 2). Accordingly, without the restriction on the resolution, the degree of deterioration of the memory device 110 or data stored in the memory device 110 may be determined by using the first and second check levels as described above.

For example, when errors, the number of which is more than a first threshold, are detected in the check read operation using the first check level and the second check level, the reliability check block 123 may determine that the reliability of target memory cells or data stored in the target memory cells is low (or the degree of deterioration is high).

The controller 120 may recover the reliability by performing a reclaim operation of reading data stored in the target memory cell and storing the read data in any other memory cells, or by performing a refresh operation of reading data stored in the target memory cell and rewriting the read data in the target memory cells.

For example, when the target memory cells are physically worn out and thus the reliability of the target memory cells is determined to be low, the controller 120 may set the target memory cells as bad memory cells and may set a storage area corresponding to the target memory cells as a bad area. The controller 120 may prohibit access to the bad area or the bad memory cells.

Figure 6:
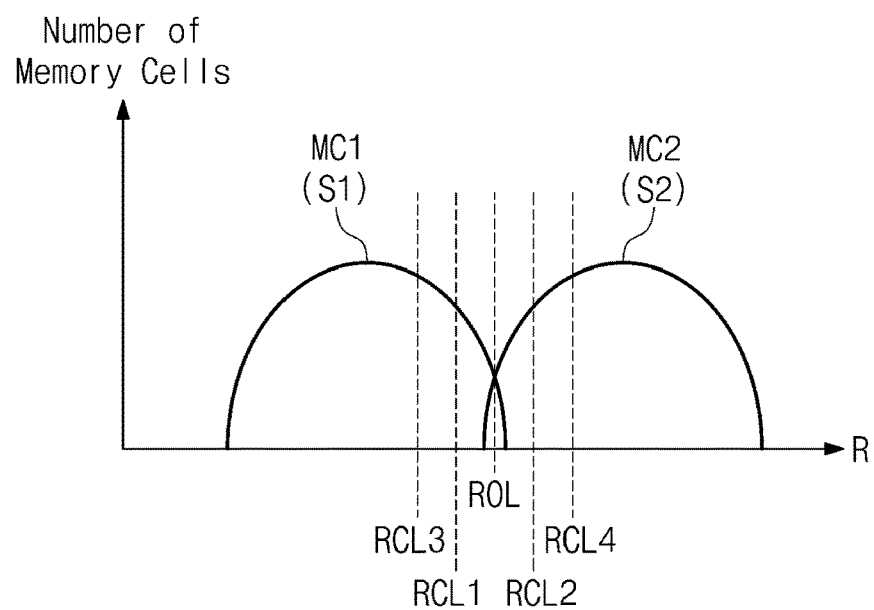
FIG. 6 illustrates an example in which additional check level resistance values corresponding to check levels used during a check read operation in a memory system are added according to embodiments of the inventive concepts.

FIG. 6 illustrates an example in which additional check level resistance values corresponding to check levels used in the check read operation in the memory system 100 are added according to embodiments of the inventive concepts. Referring to FIGS. 1, 5, and 6, a third check level resistance value RCL3 and a fourth check level resistance value RCL4 may be additionally selected, in addition to the first check level resistance value RCL1 and the second check level resistance value RCL2.

For example, the third check level resistance value RCL3 may be smaller than the first check level resistance value RCL1. When the third check level resistance value RCL3 is selected, the read and write level generation block 113 may generate a third check level corresponding to the third check level resistance value RCL3. Because the third check level resistance value RCL3 is smaller than the first check level resistance value RCL1, a voltage used as the third check level may be smaller than the voltage of the first check level, and a current amount used as the third check level may be greater than a current amount of the first check level.

For example, the fourth check level resistance value RCL4 may be greater than the second check level resistance value RCL2. When the fourth check level resistance value RCL4 is selected, the read and write level generation block 113 may generate a fourth check level corresponding to the fourth check level resistance value RCL4. Because the fourth check level resistance value RCL4 is greater than the second check level resistance value RCL2, a voltage used as the fourth check level may be greater than the voltage of the second check level, and a current amount used as the fourth check level may be smaller than a current amount of the second check level.

In an embodiment, the controller 120 may direct or instruct the memory device 110 to perform the read operation on the target memory cells with the ordinary read level. Afterwards, the controller 120 may direct the memory device 110 to perform the check operations on the same target memory cells with the first check level and the second check level. Afterwards, the controller 120 may direct the memory device 110 to perform the check operations on the same target memory cells with the third check level and the fourth check level.

The controller 120 may further detect a change in the number of errors detected by using different check levels, as well as the number of errors detected by using each check level. For example, the reliability check block 123 of the controller 120 may compare the number of first errors corresponding to the first check level and the number of third errors corresponding to the third check level.

The reliability check block 123 may determine the reliability of (or the degree of deterioration) of the target memory cells or data, based on a difference between the number of first errors and the number of third errors. For example, when the calculated difference is greater than a second threshold, the controller 120 may determine that the reliability of the target memory cells or data is low (or the degree of deterioration is high).

Likewise, the reliability check block 123 of the controller 120 may compare the number of second errors corresponding to the second check level and the number of fourth errors corresponding to the fourth check level. The reliability check block 123 may determine the reliability of (or the degree of deterioration) of the target memory cells or data, based on a difference between the number of second errors and the number of fourth errors. For example, when the calculated difference is greater than a third threshold, the controller 120 may determine that the reliability of the target memory cells or data is low (or the degree of deterioration is high).

An example is illustrated in FIG. 6 as the controller 120 performs two check operations toward a low resistance value from the ordinary level resistance value ROL and performs two check operations toward a high resistance value from the ordinary level resistance value ROL. However, the number of check operations performed on the same target memory cells is not limited to the above description. That is, a greater number of check operations may be performed on the same target memory cells. Also, when check operations are performed, the number of check operations performed in a low-resistance direction and the number of check operations performed in a high-resistance direction may not be symmetrical.

Figure 7:
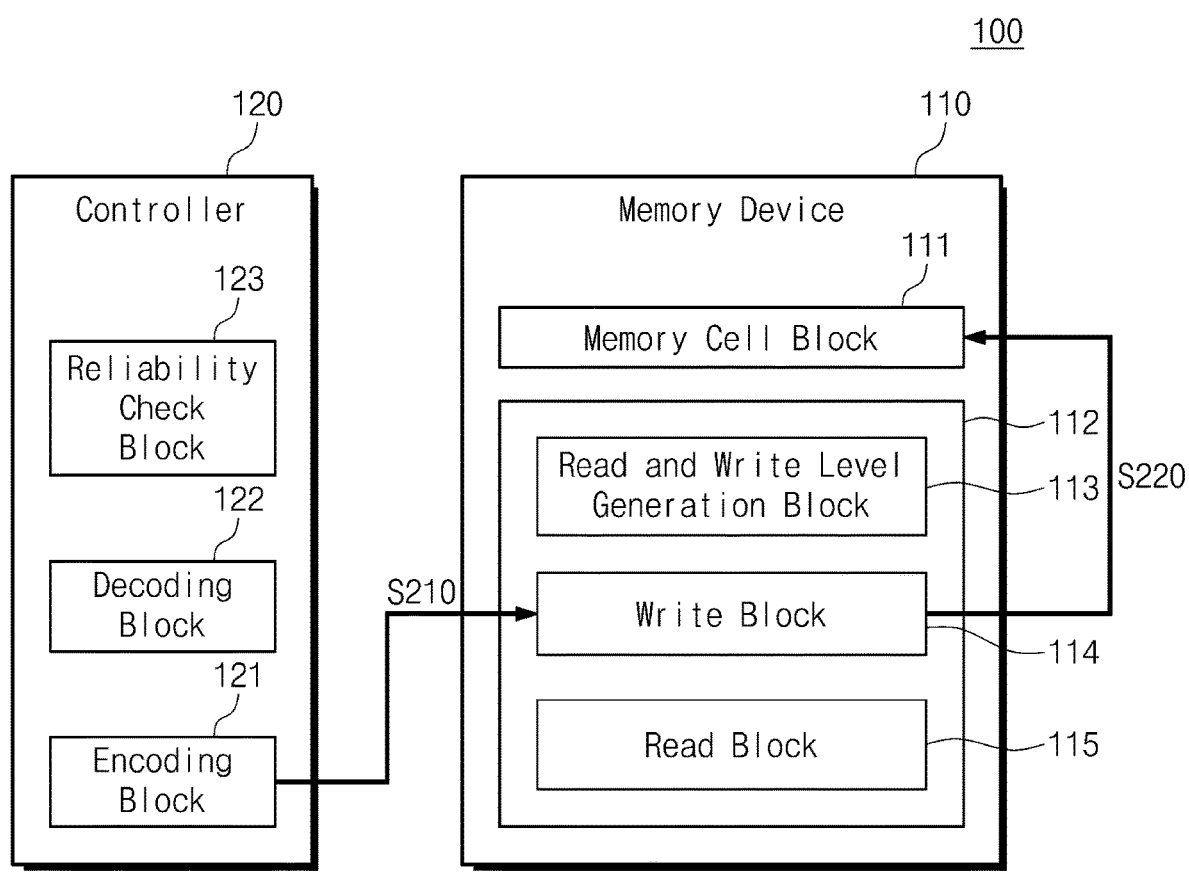
FIG. 7 illustrates an example in which a write operation is performed on target memory cells in a memory system.

FIG. 7 illustrates an example in which a write operation is performed on target memory cells in the memory system 100. Referring to FIGS. 1 and 7, the controller 120 may request the write operation on the memory device 110 through the command CMD and the control signals CTRL. The controller 120 may specify target memory cells on which the write operation will be performed, through the address ADDR.

In operation S210, the encoding block 121 of the controller 120 performs error correction encoding on original data to be written in the memory device 110 and generates parity. The controller 120 transmits the data "DATA" including the original data and the parity to the memory device 110.

The read and write level generation block 113 of the peripheral block 112 of the memory device 110 generates a write level and supplies the write level to the target memory cells of the memory cell block 111. In operation S220, the write block 114 of the peripheral block 112 of the memory device 110 writes the data "DATA" including the original data and the parity in the target memory cells of the memory cell block 111.

Figure 8:
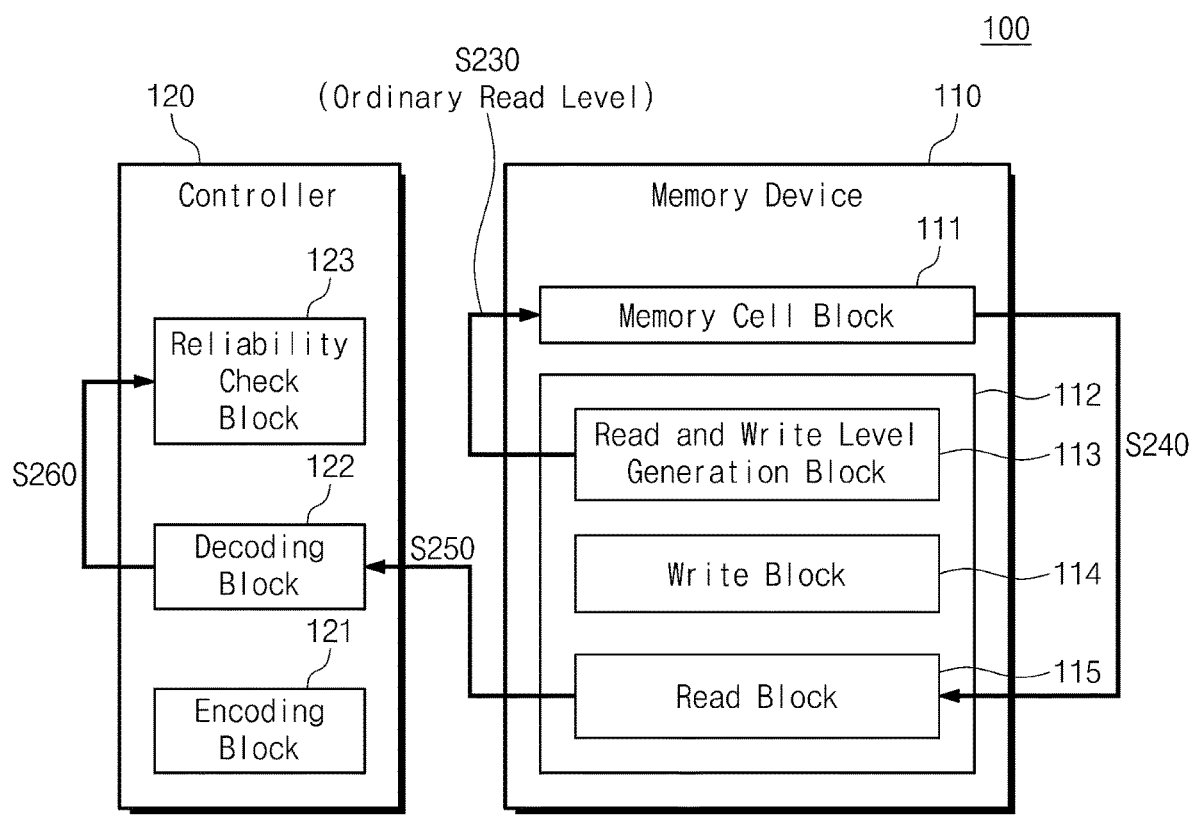
FIG. 8 illustrates an example in which a read operation is performed on target memory cells in a memory system.

FIG. 8 illustrates an example in which a read operation is performed on target memory cells in the memory system 100. Referring to FIGS. 1 and 8, the controller 120 may request the read operation of the memory device 110 through the command CMD and the control signals CTRL. The controller 120 may specify target memory cells on which the read operation will be performed, through the address ADDR.

In operation S230, the read and write level generation block 113 of the peripheral block 112 of the memory device 110 generates an ordinary read level and supplies the ordinary read level to the target memory cells of the memory cell block 111. In operation S240, the read block 115 reads data from the target memory cells of the memory cell block 111.

In operation S250, the read block 115 transmits a result of the read operation as the data "DATA" to the controller 120. The data "DATA" transmitted from the memory device 110 to the controller 120 may include original data and parity, and a part of the original data and the parity may be error bits.

In operation S260, the decoding block 122 of the controller 120 performs error correction decoding on the data "DATA" to correct error bits. The error-corrected data may be stored in a buffer inside or outside the controller 120, and may be referenced by the reliability check block 123 to monitor the reliability (or the degree of deterioration) as described with reference to operation S160 in FIG. 2.

Figure 9:
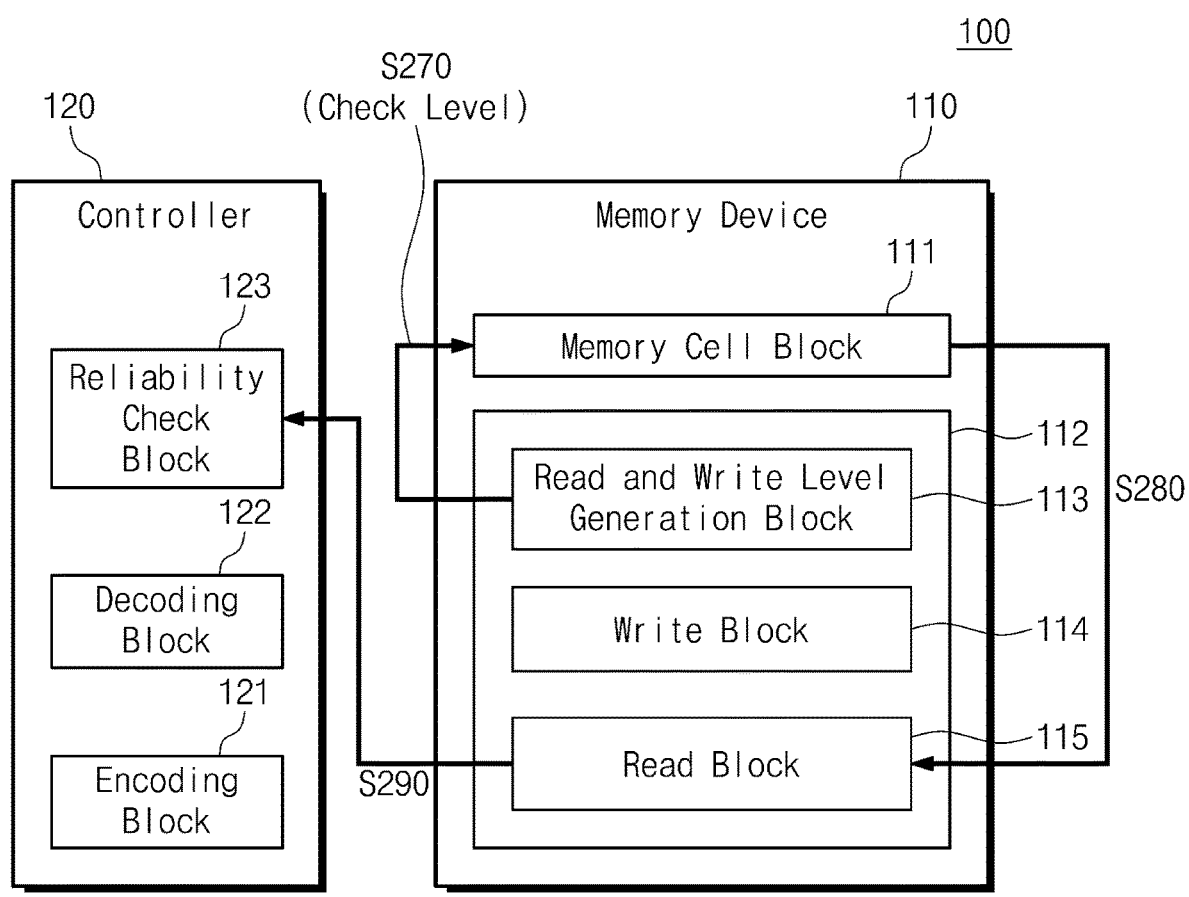
FIG. 9 illustrates an example in which a check operation is performed on target memory cells in a memory system.

FIG. 9 illustrates an example in which a check operation is performed on target memory cells in the memory system 100. Referring to FIGS. 1 and 9, the controller 120 may request the check operation on the memory device 110 through the command CMD and the control signals CTRL. The controller 120 may specify target memory cells on which the check operation will be performed, through the address ADDR.

In operation S270, the read and write level generation block 113 of the peripheral block 112 of the memory device 110 generates a check level(s) and supplies the check level(s) to the target memory cells of the memory cell block 111. In operation S280, the read block 115 reads data from the target memory cells of the memory cell block 111.

In operation S290, the read block 115 transmits a result of the read operation as the data "DATA" to the controller 120. The data "DATA" transmitted from the memory device 110 to the controller 120 may include original data and parity, and a part of the original data and the parity may be error bits. This result of the read operation may be characterized as check data.

The check operation is performed without passing through the decoding block 122. That is, the result of the read operation characterized as check data is passed to the reliability check block 123 without error correction decoding. The reliability check block 123 may remove the parity from the data "DATA" received in the check operation. The parity-removed data may include the original data, and the original data may include error bits.

As described with reference to operation S150 and operation S160 of FIG. 2, the reliability check block 123 compares the original data obtained during the read operation of FIG. 8 and the error-contained original data obtained during the check operation of FIG. 9. The reliability check block 123 may determine the number of errors occurring in the check operation based on a result of the comparison, and may determine the reliability (or the degree of deterioration) of the target memory cells or data stored in the target memory cells.

Figure 10:
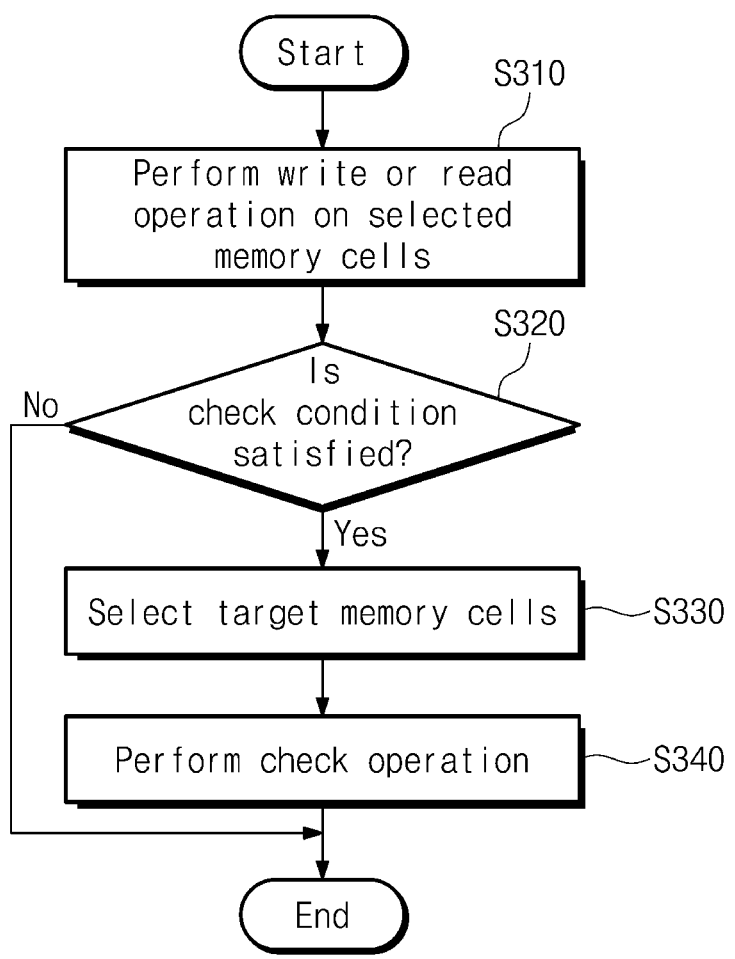
FIG. 10 illustrates a flowchart of an example in which a memory system according to embodiments of the inventive concepts performs a check operation.

FIG. 10 illustrates a flowchart of an example in which the memory system 100 according to embodiments of the inventive concepts performs a check operation. Referring to FIGS. 1 and 10, in operation S310, the memory system 100 or the controller 120 performs the write or read operation on memory cells selected from memory cells of the memory cell block 111 of the memory device 110.

In operation S320, the controller 120 determines whether a check condition is satisfied. When the check condition is not satisfied (No in operation S320), the check operation is not performed, and the process ends. When the check condition is satisfied (Yes in operation S320), in operation S330 the controller 120 selects target memory cells for the check operation. In operation S340, the controller 120 performs the check operation on the target memory cells. Afterwards, the process ends.

In an embodiment, the check condition may be an arrival of a period. That is, the controller 120 may perform the check operation periodically. The period may include a time period, a period based on the number of read operations, or a period based on the number of accesses to the memory device 110. As another example, the check condition may be a specific time. That is, the controller 120 may perform the check operation at a specific time such as a reserved time or the middle of the night.

As another example, the check condition may be a random interval. The controller 120 may count the number of read operations, the number of write operations, or an integrated (i.e., total or summed) access count of the read operation and the write operation with regard to the memory device 110. When the count reaches a threshold value, the controller 120 may perform the check operation. After performing the check operation, the controller 120 may initialize the count. Also, the controller 120 may generate a random number and may select the generated random number as a new threshold value.

In an embodiment, the target memory cells may be memory cells selected during the read operation. For example, as described with reference to FIG. 8, after the read operation is performed on the selected memory cells, the check condition may be satisfied. The controller 120 may perform the check operation on the same memory cells without performing a separate read operation.

As another example, the target memory cells may be memory cells adjacent to the memory cells selected in the read operation. For example, as described with reference to FIG. 8, after the read operation is performed on the selected memory cells, the check condition may be satisfied. The controller 120 may obtain error-free original data by performing the read operation on neighboring memory cells adjacent to the selected memory cells as described with reference to FIG. 8. Afterwards, the controller 120 may perform the check operation on the same neighboring memory cells, in the manner as described with reference to FIG. 9.

As another example, the target memory cells for the check operation may be randomly selected from the memory cells of the memory cell block 111. For another example, when the check condition is satisfied, the controller 120 may perform a scrub operation of selecting all the memory cells of the memory cell block 111 as the target memory cells and performing the check operation on the selected memory cells. That is, the target memory cells may be memory cells in an area including the selected memory cells.

In an embodiment, as described with reference to FIGS. 5 and 6, the controller 120 may perform two or more check operations on the same target memory cells by using two or more check levels.

Figure 11:
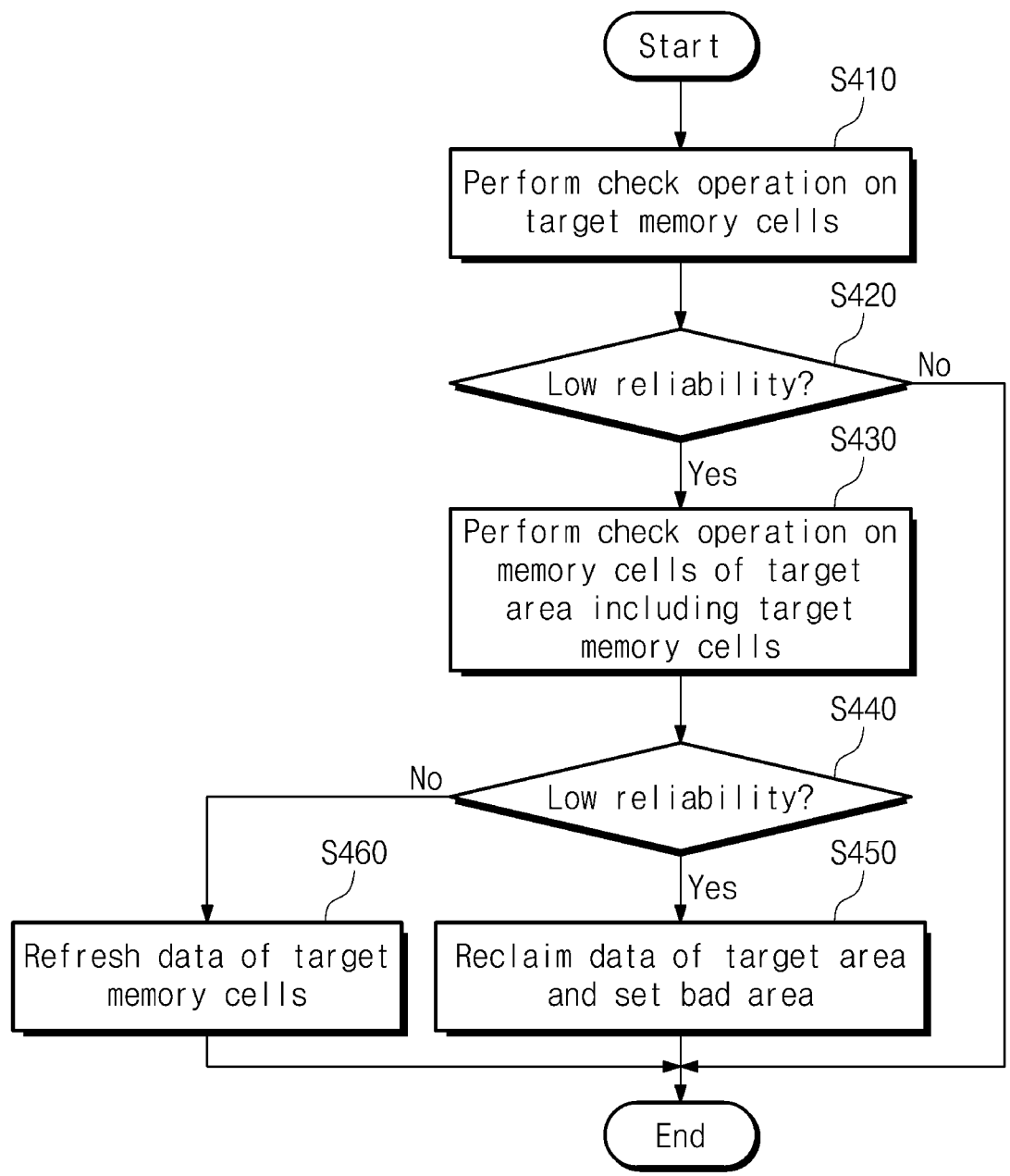
FIG. 11 illustrates a flowchart of an example in which a memory system according to embodiments of the inventive concepts determines a reliability of a memory device.

FIG. 11 illustrates a flowchart of an example in which the memory system 100 according to embodiments of the inventive concepts determines the reliability (or the degree of deterioration) of the memory device 110. Referring to FIGS. 1 and 11, in operation S410, the controller 120 performs the check operation on target memory cells. For example, as described with reference to FIGS. 5 and 6, the controller 120 may perform two or more check operations on the target memory cells by using two or more check levels.

In operation S420, the controller 120 determines whether data of the target memory cells have a low reliability. When the data of the target memory cells do not have a low reliability (No in operation S420), the process ends. When the data of the target memory cells have a low reliability (Yes in operation S420), operation S430 is performed.

In operation S430, the controller 120 performs the check operation on memory cells of a target area including the target memory cells. That is, the controller 120 may determine the reliability of data of more memory cells including the target memory cells. In other words, the check operation is expanded to a target area that includes a greater number of memory cells including the target memory cells. That is, the target area includes the target memory cells and additional memory cells other than the target memory cells.

In operation S440, the controller 120 determines whether data of the memory cells of the target area have a low reliability. When all the data of the memory cells of the target area have a low reliability (Yes in operation S440), the target area may be determined as including memory cells that have deteriorated and have become worse, and that are worn out. In operation S450, the controller 120 performs the reclaim operation of moving the data of the target area to any other memory cells and setting the target area as a bad area.

When partial data of the memory cells of the target area (e.g., data of a given ratio or higher) do not have a low reliability (No in operation S440), it may be determined that the memory cells of the target area have not deteriorated and are not worn out, and data of the memory cells of the target area have not become worse. In operation S460, the controller 120 refreshes data of target memory cells (or data of the target area having a low reliability).

Figure 12:
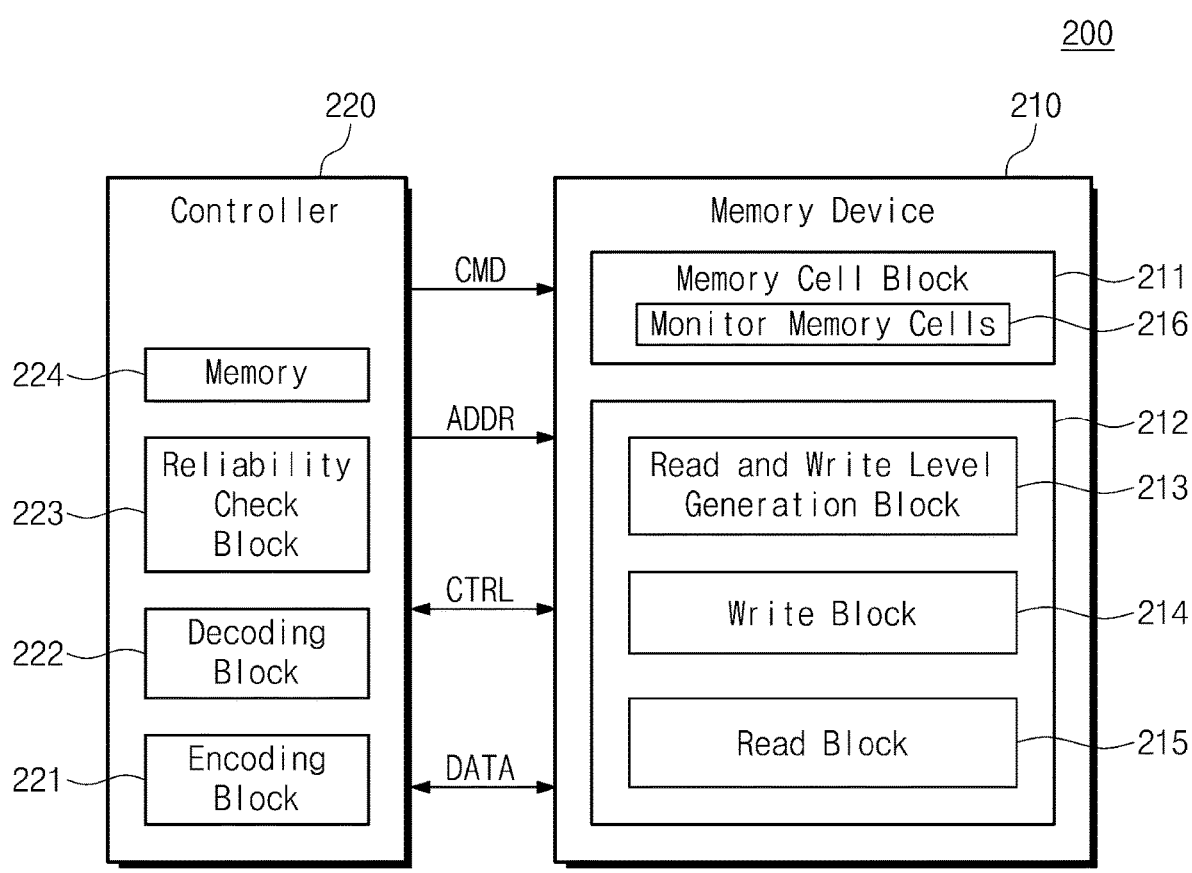
FIG. 12 illustrates a block diagram of a memory system according to other embodiments of the inventive concepts.

FIG. 12 illustrates a block diagram of a memory system 200 according to other embodiments of the inventive concepts. Referring to FIG. 12, the memory system 200 includes a memory device 210 and a controller 220.

The memory device 210 includes a memory cell block 211 and a peripheral block 212. The peripheral block 212 includes a read and write level generation block 213, a write block 214, and a read block 215. A configuration and an operation of the peripheral block 212 are identical to the configuration and the operation of the peripheral block 112 of FIG. 1. Thus, additional description associated with the peripheral block 212 will be hereinafter omitted to avoid redundancy.

Compared with the memory cell block 111 of FIG. 1, the memory cell block 211 includes monitor memory cells 216. The monitor memory cells 216 may be selected from memory cells of the memory cell block 211 and may be allocated for the check operation.

The controller 120 includes an encoding block 221, a decoding block 222, a reliability check block 223, and a memory 224. Configurations and operations of the encoding block 221, the decoding block 222, and the reliability check block 223 are respectively identical to the configurations and the operations of the encoding block 121, the decoding block 122, and the reliability check block 123 of FIG. 1. Thus, additional description of the encoding block 221, the decoding block 222, and the reliability check block 223 will be hereinafter omitted to avoid redundancy.

The controller 220 may store in the memory 224 pattern data written in the monitor memory cells 216. For example, the memory 224 may include nonvolatile storage, and the pattern data may be stored in the memory 224 upon manufacturing the memory system 200. That is, the pattern data may be characterized a predetermined pattern data that is designated upon manufacturing the memory system 200 and that may be used for comparison purposes during the lifetime of the memory system 200.

As another example, the pattern data may be stored in secure memory cells, the reliability of which is secured, from among memory cells of the memory cell block 211. When power is supplied to the memory system 200, the read block 215 may read the pattern data from the secure memory cells. The controller 220 may store the pattern data transmitted from the memory device 210 in the memory 224.

That is, the data written in the monitor memory cells 216 may be stored in the memory 224, and thus, the controller 220 may know in advance the data (i.e., the pattern data) initially written in the monitor memory cells 216.

In addition, the controller 220 may store an address of the monitor memory cells 216 and an address of memory cells (e.g., ordinary memory cells) paired with the monitor memory cells 216 in the memory 224. As described above, the addresses may be stored in the memory 224 upon manufacturing the memory system 200 or when a power is supplied to the memory system 200.

Figure 13:
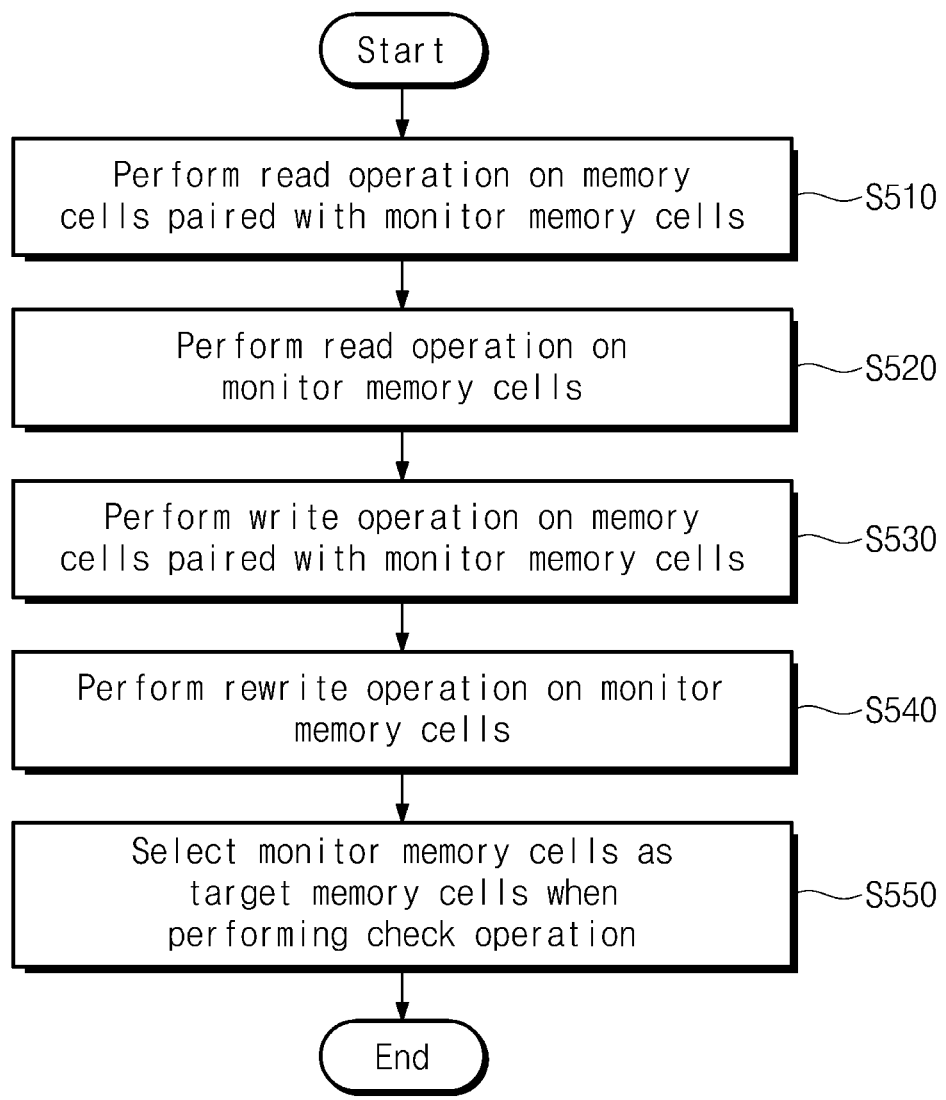
FIG. 13 illustrates a flowchart of an operating method of a memory system according to embodiments of the inventive concepts.

FIG. 13 illustrates a flowchart of an operating method of the memory system 200 according to embodiments of the inventive concepts. Referring to FIG. 13, in operation S510, the controller 120 performs the read operation on memory cells of the memory device 210 based on a request of an external host device (not shown) or an internal schedule. For example, the memory cells targeted for the read operation may be paired with monitor memory cells 216. Whether the memory cells are paired with monitor memory cells 216 may be determined with reference to the memory 224.

After the read operation is performed on the memory cells paired with the monitor memory cells 216, in operation S520, the controller 220 identically performs the read operation on the monitor memory cells 216. As the read operation is performed on the monitor memory cells 216, deterioration (or wear) that occurred in ordinary memory cells due to the read operation in operation S510 may identically occur in the monitor memory cells.

In operation S530, the controller 120 performs the write operation on memory cells of the memory device 210 based on a request of the external host device or an internal schedule. For example, the memory cells targeted for the write operation may be paired with the monitor memory cells 216. Whether the memory cells are paired with monitor memory cells 216 may be determined with reference to the memory 224.

After the write operation is performed on the memory cells paired with the monitor memory cells, in operation S540, the controller 220 performs a rewrite operation on the monitor memory cells 216. The rewrite operation includes writing data of the monitor memory cells 216 to an initial state, and writing the pattern data stored in the memory 224 in the monitor memory cells 216.

As the rewrite operation is performed on the monitor memory cells 216, deterioration (or wear) that occurred in ordinary memory cells due to the write operation in operation S530 may identically occur in the monitor memory cells 216 or may relatively greatly occur in the monitor memory cells 216.

The degree of deterioration (or the degree of wear) of the monitor memory cells 216 may track the degree of deterioration (or the degree of wear) of the ordinary memory cells, based on operation S510 to operation S540. As the check operation is performed on the monitor memory cells 216, the degree of deterioration (or the degree of wear) of the ordinary memory cells may be predicted. Accordingly, in operation S550, upon performing the check operation, the monitor memory cells 216 may be selected as target memory cells.

In the case where the monitor memory cells 216 are selected as target memory cells, the ordinary read operation described with reference to FIG. 8 may be omitted with respect to the monitor memory cells 216. Original data stored in the monitor memory cells may be obtained from the pattern data stored in the memory 224.

The number of errors generated by the check operation may be calculated by performing the check operation on the monitor memory cells 216, removing parity from data obtained as a result of the check operation, and comparing the parity-removed data and the pattern data stored in the memory 224. The reliability (or the degree of deterioration) of the memory cells of the memory cell block 211 or data may be determined based on the number of errors.

In an embodiment, when the write operation is performed on the ordinary memory cells paired with the monitor memory cells 216 for the first time, the controller 220 may write the pattern data in the monitor memory cells 216 for the first time.

Figure 14:
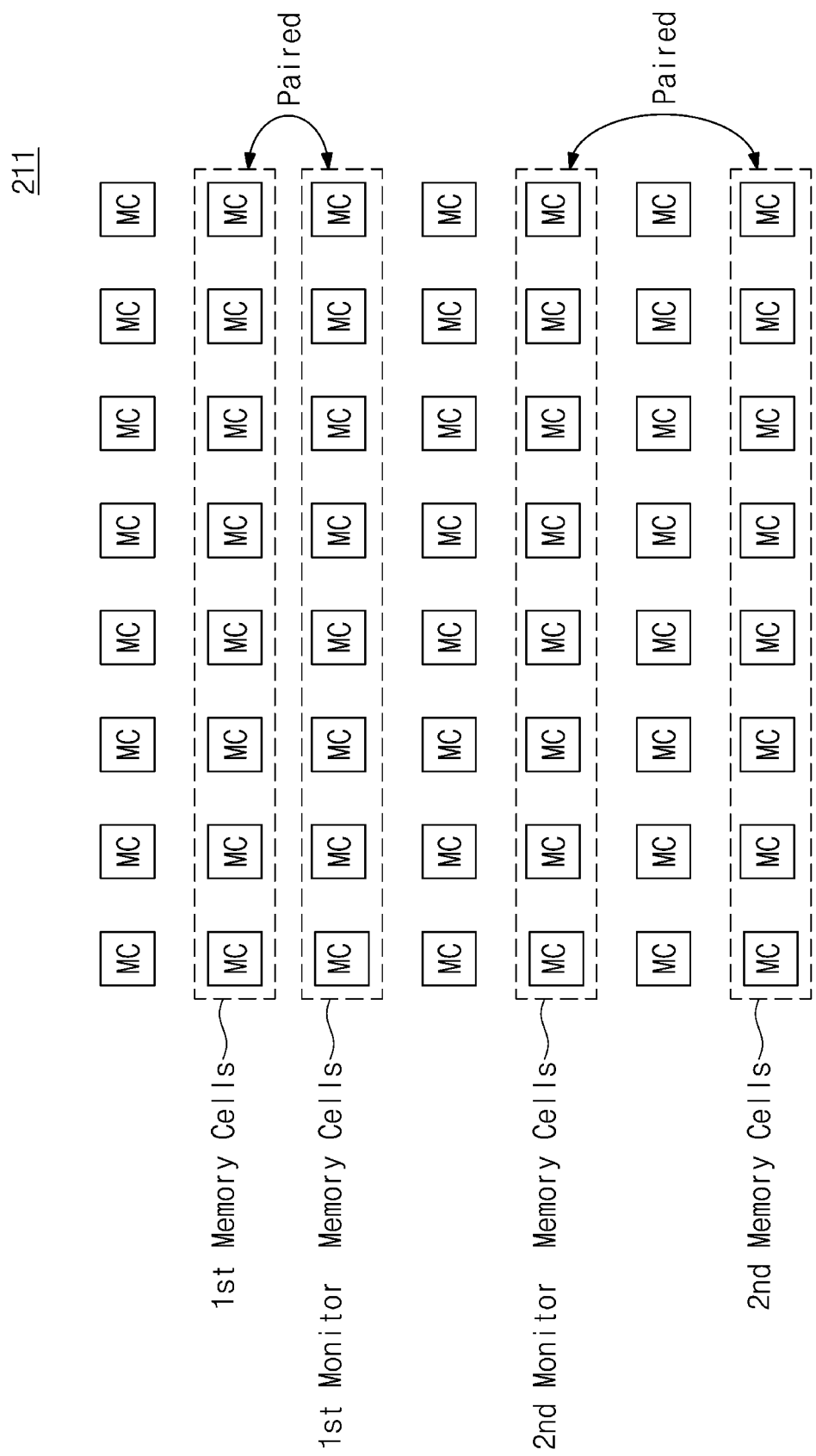
FIG. 14 illustrates an example of monitor memory cells and ordinary memory cells paired with the monitor memory cells.

FIG. 14 illustrates an example of monitor memory cells and ordinary memory cells paired with the monitor memory cells. Referring to FIGS. 12 and 14, memory cells MC of the memory cell block 211 may be arranged in rows and columns. Memory cells of specific rows may be specified as first monitor memory cells and second monitor memory cells. For example, the controller 220 may specify the first and second monitor memory cells by storing addresses of the first and second monitor memory cells in the memory 224.

Memory cells of specific rows may be specified as first and second memory cells paired with the first and second monitor memory cells. For example, the controller 220 may specify the first and second memory cells by storing addresses of the first and second memory cells in the memory 224.

The monitor memory cells may be distributed and disposed across the memory cells MC to make it easy to track the deterioration (or wear) of ordinary memory cells. The number of pairs of monitor memory cells and ordinary memory cells may be two or more.

In an embodiment, when a specific condition is satisfied, the controller 220 may again specify ordinary memory cells to be paired with the monitor memory cells. For example, when the memory system 200 is initialized or in response to a command for requesting re-pairing, the controller 220 may again specify ordinary memory cells to be paired with the monitor memory cells.

In an embodiment, when a specific condition is satisfied, the controller 220 may again specify monitor memory cells. For example, when the memory system 200 is initialized or in response to a command for requesting reallocation, the controller 220 may again specify monitor memory cells.

As described above, the memory system 100 or 200 according to embodiments of the inventive concepts may amplify a read error by performing the check operation by using a check level. By amplifying the read error, the memory system 100 or 200 may determine the reliability (or the degree of deterioration) of memory cells or data stored in the memory cells with higher resolution.

The check operation may be performed on selected memory cells to be accessed by the write operation or the read operation, or on memory cells associated with the selected memory cells. As another example, the check operation may be performed on monitor memory cells specified for the check operation.

Components of the memory systems 100 and 200 have been described using the terms "first", "second", "third", and the like. However, the terms "first", "second", "third", and the like may be used merely to distinguish components from each other, and should not limit the inventive concepts. For example, the terms "first", "second", "third", and the like do not involve an order or a numerical meaning of any form.

Components according to embodiments of the inventive concepts are described by using blocks. The blocks may be implemented with various hardware devices, such as for example integrated circuits, application specific ICs (ASICs), field programmable gate arrays (FPGAs), and complex programmable logic devices (CPLDs). The blocks may be for example firmware driven in hardware devices, software such as applications, or a combination of hardware devices and software. Also, the blocks may include circuits or intellectual property (IP) implemented with semiconductor elements in an integrated circuit.

According to embodiments of the inventive concepts, a semiconductor memory system may perform a check read operation on a semiconductor memory device to amplify the number of errors. By amplifying and monitoring the number of errors, a memory system which monitors deterioration of the semiconductor memory device or data stored in the semiconductor memory device with high resolution and high accuracy, and an operating method of the memory system, are provided.

While the inventive concepts have been described with reference to exemplary embodiments thereof, it should be apparent to those of ordinary skill in the art that various changes and modifications may be made thereto without departing from the spirit and scope of the inventive concepts as set forth in the following claims.

What is claimed is:
1. A memory system comprising:
a memory device including memory cells; and
a controller configured to perform a write operation, a read operation, and a check operation on the memory device, wherein during the check operation, the controller is further configured to:
control the memory device to acquire check data from target memory cells of the memory cells by using a check level that differs from every prospective read level used for performing the read operation,
compare the check data with original data stored in the target memory cells to provide a comparison result, and
determine a reliability of the target memory cells or the check data based on the comparison result.

2. The memory system of claim 1, wherein:
the target memory cells store the original data and an error correction parity, and
the controller is configured to remove a portion corresponding to the error correction parity from the check data to generate second check data and compare the second check data with the original data.

3. The memory system of claim 2, wherein the controller is configured to not perform error correction decoding on the check data.

4. The memory system of claim 1, wherein during the check operation, the controller is further configured to:
control the memory device to read first data from the target memory cells by using an ordinary read level; and
perform error correction decoding on the first data to obtain the original data.

5. The memory system of claim 1, wherein the controller is configured to select the target memory cells from the memory cells periodically and then perform the check operation on the target memory cells.

6. The memory system of claim 1, wherein the controller is configured to select the target memory cells from the memory cells at a specific time and then perform the check operation on the target memory cells.

7. The memory system of claim 1, wherein the controller is configured to select the target memory cells from the memory cells at a random interval and then perform the check operation on the target memory cells.

8. The memory system of claim 1, wherein after performing either of the write operation and the read operation on selected memory cells selected from the memory cells, the controller is configured to specify the selected memory cells as the target memory cells for the check operation.

9. The memory system of claim 1, wherein after performing either of the write operation and the read operation on selected memory cells selected from the memory cells, the controller is configured to specify memory cells adjacent to the selected memory cells as the target memory cells for the check operation.

10. The memory system of claim 1, wherein after performing either of the write operation and the read operation on selected memory cells selected from the memory cells, the controller is configured to specify memory cells in a specific area including the selected memory cells as the target memory cells for the check operation.

11. The memory system of claim 1, wherein the controller is configured to specify the target memory cells of the memory cells randomly for the check operation.

12. The memory system of claim 1, wherein:
the check level includes a first check level and a second check level, and the check data includes first check data and second check data, and
the controller is configured to acquire the first check data and the second check data from the target memory cells by using the first check level that is lower than an ordinary read level used upon performing the read operation on the target memory cells, and by using the second check level that is higher than the ordinary read level.

13. The memory system of claim 12, wherein when one of a first difference between the first check data and the original data, and a second difference between the second check data and the original data, is greater than a threshold, the controller is configured to determine that the reliability of the target memory cells or the check data stored in the target memory cells is low.

14. The memory system of claim 1, wherein:
the check level includes a first check level and a second check level, and the check data includes include first check data and second check data, and
the controller is configured to acquire the first check data and the second check data from the target memory cells by using the first check level that is lower than an ordinary read level used upon performing the read operation on the target memory cells, and by using the second check level that is lower than the first check level.

15. A memory system comprising:
a memory device including memory cells and monitor memory cells; and
a controller configured to perform a write operation, a read operation, and a check operation on the memory device, wherein during the check operation, the controller is further configured to:
control the memory device to acquire check data from the monitor memory cells by using a check level that differs from every prospective read level used for performing the read operation,
compare the check data with original data stored in the monitor memory cells to provide a comparison result, and
determine a reliability of the memory cells or data stored in the memory cells based on the comparison result.

16. The memory system of claim 15, wherein the controller is further configured to:
pair selected memory cells selected from the memory cells with the monitor memory cells; and
perform a read operation on the selected memory cells.

17. The memory system of claim 16, wherein the controller is further configured to perform a rewrite operation on the monitor memory cells after performing a write operation on the selected memory cells.

18. The memory system of claim 15, wherein the controller is further configured to write predetermined pattern data in the monitor memory cells.

19. An operating method of a memory system, the memory system comprising a memory device including memory cells and a controller controlling the memory device, the method comprising:
performing, at the memory device, a read operation or a write operation on target memory cells of the memory cells;
determining, at the controller, a reliability of the target memory cells based on a result of the read operation or the write operation; and
when the reliability of the target memory cells is determined to be low, performing, at the memory device, a check operation on the target memory cells, wherein the check operation comprises:
acquiring, at the memory device, check data by applying a check level to the target memory cells that differs from every prospective read level used for performing the read operation, and
comparing, at the controller, the check data with original data stored into the target memory cells.

* * * * *